ELECTROMECHANICAL OSCILLATOR DETECTOR SYSTEM

Filed July 1, 1953 2 Sheets-Sheet 1

INVENTORS
ALBERT L. CAVALIERI, JR.
ROBERT W. ROOP
BY
Brown, Denk & Synnestvedt
AGENTS INVENTORS
ALBERT L. CAVALIERI, JR.
ROBERT W. ROOP
BY
Brown, Denk & Synnestvedt
AGENTS United States Patent Office 2,747,090

Patented May 22, 1956

2,747,090

ELECTROMECHANICAL OSCILLATOR DETECTOR SYSTEM

Albert L. Cavalieri, Jr., Philadelphia, Pa., and Robert W. Roop, Sewell, N. J., assignors to Philco Corporation, Philadelphia, Pa., a corporation of Pennsylvania Application July 1, 1953, Serial No. 365,404

6 Claims. (Cl. 250—36)

This invention relates to electromechanical systems, and more particularly to a novel oscillator-detector system employing a vibratory reed as a frequency sensitive element.

In the design of electronic circuits it is frequently necessary to employ a circuit that will respond only to a signal at one precise frequency and, in responding, provide an output signal having an amplitude many times the amplitude of the input signal. In other instances it is necessary to employ a circuit that will generate an output signal at a precise frequency in the absence of any synchronizing signal. Two examples of circuits of the latter type are the well known forms of sinusoidal waveform generators and equally well known forms of relaxation oscillators or sawtooth waveform generators. Circuits of the first type include frequency-sensitive detector-amplifier circuits. At audio frequencies the inductors and capacitors required in the tank circuits of sinusoidal waveform generators are bulky and expensive. Furthermore, the frequency of oscillation of a sinusoidal waveform generator may drift by an undesirable amount unless it is stabilized in some manner, for example by the use of a piezoelectric crystal. Relaxation oscillators are less expensive to construct but are generally subject to extreme frequency variations unless an external synchronizing signal of the appropriate frequency is supplied to control the operation thereof. It is not always convenient or economical to supply such a synchronizing signal. In many instances in the design of electronic circuits it is desirable to provide a sawtooth waveform and a sinusoidal waveform of exactly the same frequency. Heretofore, this has required two separate waveform generators, one controlled by the other, or one generator followed by suitable filter circuits which derive the second signal from the first signal. Needless to say, such circuits occupy considerable space and are relatively expensive in terms of components and assembly time. Furthermore, the conventional forms of signal generators are not well adapted for use as frequency-sensitive detector-amplifier circuits. Conventional frequency-sensitive detectors designed to operate in the audio frequency range require large and expensive inductors and capacitors and are subject to the same disadvantages as sinusoidal waveform generators.

Our copending application, Serial No. 358,286, filed May 29, 1953, describes and claims a novel vibratory reed structure comprising a vibratory reed element having an electrostrictive member secured adjacent one end thereof and in a position to be strained by the vibration of the reed element. This reed structure is relatively inexpensive to manufacture, it occupies very little space and it has a relatively stable operating frequency. Because the reed structure has these characteristics, it is ideally suited for use as a frequency stabilizing element in circuits operating at frequencies extending from the subaudible to the superaudible range. We have discovered a novel circuit incorporating the above-described reed structure which may be operated either as an oscillator or as a frequency-sensitive detector. The novel circuit overcomes all of the disadvantages of the prior art circuits noted above.

Therefore it is an object of the present invention to provide a novel, inexpensive oscillator circuit having a relatively stable operating frequency.

It is a further object of the present invention to provide a novel oscillator circuit which employs a vibratory reed structure as the frequency controlling element thereof.

Still another object of the present invention is to provide a circuit for generating a substantially sawtooth waveform and a substantially sinusoidal waveform, the periods of the two waveforms being related by a simple integer.

Still another object of the present invention is to provide a novel circuit that can be employed either as an oscillator or as a frequency-sensitive detector circuit.

In general, the means for accomplishing these and other objects of the invention comprises a novel oscillator circuit of the relaxation oscillator type in which at least a part of the capacitance in a resistor-capacitor frequency controlling circuit is the capacitance of an electrostrictive member secured to a vibratory reed element. In this novel circuit the reed element is energized by the change in shape of the electrostrictive member which results when the electrical energy stored by the electrostrictive member is discharged through a voltage sensitive gaseous discharge device. The vibration of the reed element causes an alternating signal to appear at suitable electrodes on the electrostrictive member. This signal acts as a synchronizing signal in controlling the time of firing of the gaseous discharge device.

For a better understanding of the present invention together with other and further objects thereof reference should now be made to the following detailed description which is to be read in connection with the accompanying drawings in which.

Figures 1, 2, 3:
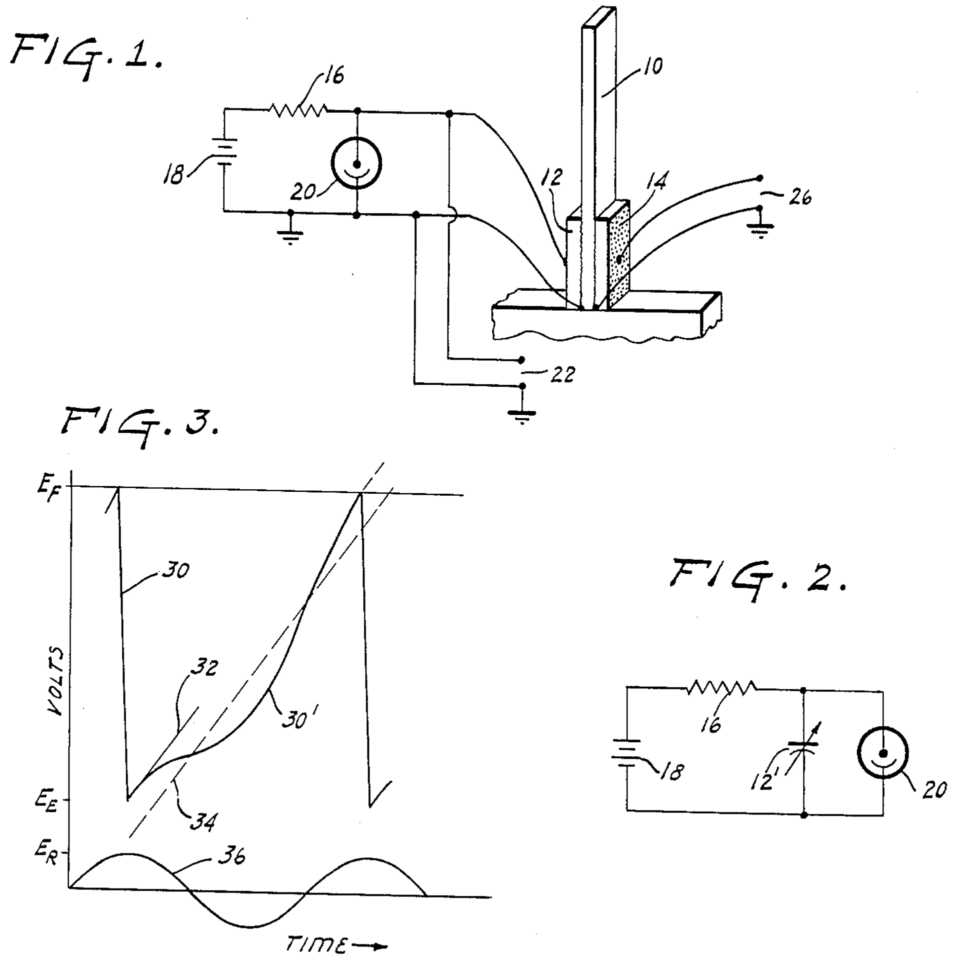
Fig. 1 is a schematic view of a preferred embodiment of the present invention arranged as an oscillator circuit.
Fig. 2 is an equivalent circuit of the embodiment shown in Fig. 1.
Fig. 3 is a plot showing the signal generated by the circuit of Fig. 1 for one set of operating conditions.

Turning now to Fig. 1, the preferred embodiment of the present invention comprises a reed element 10 having two electrostrictive members 12 and 14 secured thereto in a position to be strained by the vibrations of reed element 10. The vibratory reed system of the present invention may take any of the forms shown in our above-identified copending application, some of which employ only one electrostrictive member but, for reasons which will appear presently, it is preferable to employ a vibratory reed system having the second electrostrictive member 14 secured to reed 10. As explained in greater detail in our copending application, reed element 10 may be formed of some highly elastic material such as steel or glass. Members 12 and 14 are formed of an electrostrictive material which exhibits the property of causing a charge to appear between two opposite faces of the member when it is strained, that is, deformed or changed in dimension, by an externally applied stress. Electrostrictive members 12 and 14 possess the correlated property of changing dimension in response to an electrical signal impressed on these two faces. Polarized barium titanate is a material exhibiting these properties. Members 12 and 14 are provided with conductive area electrodes on the faces adjacent reed element 10 and on the parallel faces remote from reed element 10. These electrodes may be formed of fired platinum or other suitable material. The area of these electrodes will determine the capacitance presented by member 12 and, to a certain extent, the amplitude of the mechanical signal supplied to reed 10 and the electrical signal appearing across members 12 and 14. Members 12 and 14 may be secured to reed element 10 by means of a thermosetting bonding material or in any other suitable manner. Connected in series with member 12 is a resistor 16 which has a value such that the time constant of the circuit including resistor 16 and the member 12 is of the same order of magnitude as a period of vibration of reed element 10. A source of D. C. potential 18, which is represented in Fig. 1 by the conventional symbol for a battery but which may comprise any of the well known forms of D. C. potential sources, is connected across the series combination of resistor 16 and member 12. Preferably the common terminal of source 18 and member 12 is maintained at some fixed reference potential, represented by the ground symbol, to minimize the effects of stray capacitance and the like.

A gaseous discharge tube 20 is connected in shunt with member 12. Tube 20 has the characteristic that it will not conduct until the potential applied thereacross reaches a predetermined value. If the applied potential exceeds this predetermined value, tube 20 will conduct or "fire" and conduction will continue until the applied potential drops below some lower value determined by the characteristics of the tube. By way of example, tube 20 may be a neon filled tube which fires at approximately 70 volts applied potential and ceases to conduct when the applied potential drops to a value of approximately 15 volts. Terminals 22 and 26 are connected to the electrodes on members 12 and 14 respectively, to provide means for obtaining electrical output signals from the circuit of Fig. 1.

Fig. 2 is an equivalent circuit of the system shown in Fig. 1 with the terminals 22 and 26 omitted. In the equivalent circuit of Fig. 2 the reed structure including reed element 10 and members 12 and 14 has been replaced by the symbol of a variable capacitor 12'. Capacitor 12' represents the capacitance of member 12. The magnitude of this capacitance is determined by the area of the conductive electrodes on the two faces of member 12, the spacing between these conductive electrodes and the dielectric constant of the electrostrictive material from which member 12 is formed. The D.-C. source 18, resistor 16 and gaseous discharge tube 20 shown in Fig. 2 correspond to similarly numbered elements in Fig. 1.

The novel oscillator system shown in Fig. 1 operates in the following manner. Source 18 is selected to have a potential considerably higher than the potential required to fire tube 20. When the system is placed in operation, current flows from source 18 through resistor 16 to charge the capacitor formed by member 12 and its associated electrodes. The rate at which this capacitor, which for convenience will be referred to as capacitor 12', is charged is determined by the RC time constant of the charging circuit and the potential supplied by source 18. When the potential across capacitor 12' reaches the firing potential of tube 20, thus tube starts to conduct and, in so doing, rapidly discharges capacitor 12'. This rapid discharge of capacitor 12' represents a rapid change of charge between the two faces of electrostrictive member 12. This rapid change of charge between these two faces will cause member 12 to change in dimension and shock excite reed element 10 into oscillation. This oscillation will be at the resonant frequency of the reed system.

The discharge of capacitor 12' lowers the potential across tube 20 below the level necessary to sustain conduction. When tube 20 ceases to conduct, capacitor 12' starts to recharge through resistor 16 in the manner described above. The oscillation of reed element 10 strains electrostrictive member 12 in a periodic fashion and, in so doing, causes an alternating potential to appear between the two faces thereof. This alternating potential may be represented in the equivalent circuit of Fig. 2 as a small generator (not shown) in series with capacitor 12', or it may be represesented by a periodic variation in the size of capacitor 12'. Either method of representing this potential will lead to a similar result since a periodic variation in capacitance of a capacitor having a fixed charge impressed thereon will result in a periodic change in the voltage appearing across the capacitor. The periodic change in voltage appearing across capacitor 12' resulting from the vibration of reed element 10 will be super-imposed upon the potential existing across this capacitor as a result of the recharging of capacitor 12' through resistor 16.

The relationship between the alternating potential resulting from reed element 10 and the recharging of capacitor 12' from resistor 16 is illustrated in Fig. 3. In Fig. 3 the solid line 30 represents the potential appearing across capacitor 12' of Fig. 2 or member 12 of Fig. 1. As shown in Fig. 3, the potential falls rapidly from a potential $E_f$, which is the firing potential of tube 20, to a much lower value $E_e$ which is the extinction voltage of tube 20. Once tube 20 ceases to conduct the potential appearing across capacitor 12' tends to return toward the potential of source 18 along an exponential charging path represented by the line 32. If the potential of source 18 is much higher than the firing potential of tube 14, path 32 will be a substantially straight line. For reasons that will appear presently, it has been assumed in drawing Fig. 3 that, at the instant that tube 20 conducts to discharge capacitor 12', reed 10 is stressing member 12 in a manner to cause a positive signal to appear thereacross. Therefore, the charging of capacitor 12' along path 32 may be resolved into two components, one an exponential charging path 34 which originates at a point below the extinction potential of tube 20 by the amplitude of the electrostrictive voltage appearing across capacitor 12' and the other a sinusoidal component 36 which is the electrostrictive potential appearing across capacitor 12' as a result of the vibration of reed element 10. The constants of the charging circuit including potential source 18, resistor 16 and capacitor 12' are so chosen that the exponential path 34 reaches the firing potential $E_f$ in a time slightly greater than a period of the sinusoidal component 36. It will be recognized that this represents a time slightly greater than the time required for reed element 10 to make one complete oscillation. The rate at which curve 34 rises can be changed by changing the potential of source 18, the value of resistor 16 or the capacitance of member 12. In most instances it will be more convenient to change the size of resistor 16 or the potential supplied by source 18 than to change the size of capacitor 12'. It is possible to place additional capacitance in shunt or in series with member 12 to change the effective capacitance thereof but this change in the circuit generally reduces the effective amplitude of the electrostrictive component of voltage.

Returning once again to Fig. 3, the charging portion 30' of curve 30 is equal to the sum of curve 34 and curve 36 and therefore represents the total voltage appearing across capacitor 12'. If the time constant of the charging circuit has been chosen correctly, the potential across capacitor 12', as represented by curve 30', will reach the firing potential $E_f$ at a time just preceding the positive peak of component 36. The discharge of capacitor 12' will again shock excite reed element 10. If the time constant of the charging circuit has been properly chosen, the second shock excitation of reed element 10 will be in proper phase to reinforce the vibration of reed element 10 caused by the first shock excitation. Therefore, the charging and discharging cycles just described will continue with the period of each cycle determined by the period of vibration of reed element 10. A study of Fig. 3 will show that minor changes in the slope or position of the exponential charging curve 34, which might result from changes in the potential supplied by source 18 or changes in the value of resistor 16 or capacitor 12', will only shift slightly the point on waveform 36 at which tube 20 conducts without altering the period of the charging and discharging cycles. Therefore, for a comparatively wide range of values of the circuit parameters, the frequency of operation of the circuit shown in Fig. 1 is determined solely by the frequency of the reed system including reed element 10.

If the value of potential supplied by source 18, or the value of resistor 16, changes to such an extent that the signal supplied by member 12 is no longer able to synchronize the operation of the system, the length of the charge-discharge cycles of the system will become very irregular, thereby giving a clear indication that the circuit needs readjustment.

A waveform corresponding to curve 30 in Fig. 3 may be obtained at terminals 22 of the circuit shown in Fig. 1. This signal is substantially a sawtooth wave since the amplitude of the component 36 is of the order of $\frac{1}{10}$ the amplitude variation of curve 30. The utilizing device connected across terminals 22 should have a high impedance so that the operation of the circuit just described will not be adversely affected by the shunting effect of the utilizing device.

The circuit shown in Fig. 1 provides a second output signal at terminals 26. The signal appearing at terminals 26 will be a sinusoidal voltage corresponding in frequency and related in phase to component 36 in Fig. 3. This signal is generated by electrostrictive member 14 as it is stressed by the vibration of reed element 10. Terminals 26 may be electrically isolated from the oscillator circuit just described by forming reed element 10 or the bonding material of some non-conductive material. As suggested above, the circuit shown in Fig. 1 provides a sinusoidal signal at terminals 26 which has exactly the same frequency as the sawtooth signal appearing at terminals 22 and is substantially fixed in phase with respect to this sawtooth signal.

Figure 4:
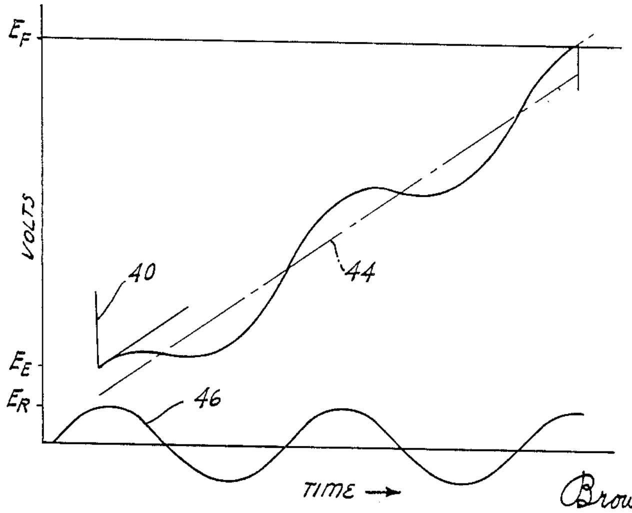
Fig. 4 is a plot showing the signal generated by the circuit of Fig. 1 for a second set of operating conditions.

In the foregoing discussion it has been assumed that capacitor 12' recharged to substantially the firing potential of tube 20 in one period of the vibration of reed element 10. It should be obvious to those skilled in the art that the oscillator circuit will operate in a similar manner if the charging time of the circuit is increased so that it equals some small integral number of periods of vibration of reed element 10. Fig. 3 is a plot showing the potentials existing in the circuit of Fig. 1 when the charging time of the circuit has been changed so that tube 20 fires once for every two complete vibrations of reed element 10. In Fig. 4 curve 40 corresponds to curve 30 in Fig. 3 and curves 44 and 46 correspond to curves 34 and 36 in Fig. 3.

It is impossible to set precise limits on the frequency of operation of the system shown in Fig. 1 but it has been found that it will operate satisfactorily from subaudible frequencies to frequencies of the order of several kilocycles per second. As explained in our copending application, reed element 10 and members 12 and 14 may be so constructed that they occupy a space of less than one cubic inch. Therefore the system shown in Fig. 1 is a very stable, inexpensive and compact form of audio oscillator.

As suggested above, the reed structure employed in our novel oscillator circuit may take any of the forms described in our copending application. Another possible modification of the circuit shown in Fig. 1 is to employ a bimorph composed of two strips of electrostrictive material joined together to form a resonant element. It has been found that a bimorph, comprising two strips of 0.020 barium titanate approximately $\frac{1}{16}''$ wide by $1''$ long and polarized so that the outer faces are positive with respect to the faces in contact, may be made to oscillate at a frequency of 2 kilocycles when connected in a circuit of the type shown in Fig. 1.

Figure 5:
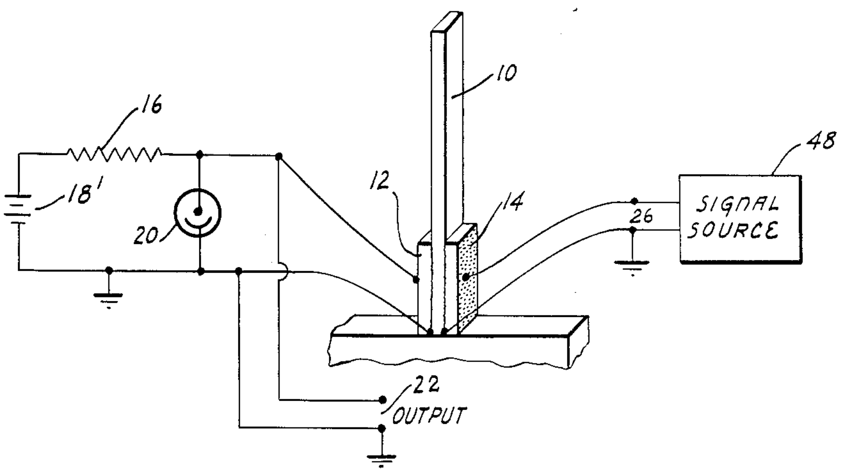
Fig. 5 is a schematic view of a circuit of the type shown in Fig. 1 arranged as a frequency sensitive detector circuit.

In the foregoing description of the operation of Fig. 1 it has been assumed that the potential supplied by source 18 was much greater than the firing potential of tube 20. Fig. 5 shows a circuit that is similar to the circuit of Fig. 1 except that the potential supplied by source 18 is slightly less than the firing potential of tube 20 and a signal from source 48 is supplied to terminals 26. Parts in Fig. 5 corresponding to like parts in Fig. 1 have been given the same reference numerals. The circuit of Fig. 5 comprises a frequency sensitive detector circuit. The operation of this circuit will be explained by reference to the waveforms shown in Fig. 6.

Figure 6:
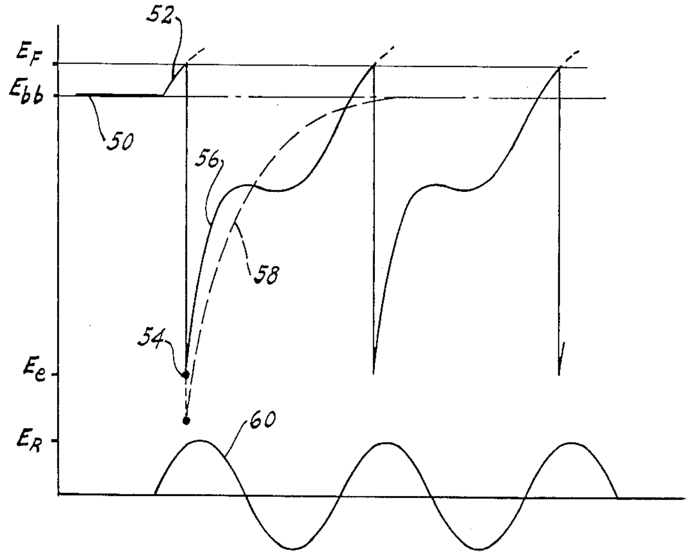
Fig. 6 is a plot showing the signal generated by the circuit of Fig. 5.

In Fig. 6 the potential of source 18 is represented by the level $E_{bb}$ which is lower than the firing potential $E_f$ of tube 20 by an amount less than the maximum amplitude of the alternating component of the signal from member 12. The signal to be detected is supplied by source 48 to the circuit of Fig. 5 at terminals 26. Signal source 48 may be a microphone, hydrophone, radio receiver or some form of signal generator. If the signal at terminals 26 does not contain a component having a frequency equal to the natural resonant frequency of reed element 10, no sustained vibration of reed element 10 will take place. Therefore capacitor 12' will charge to the potential of source 18 and remain at this potential since the potential across tube 20 is insufficient to cause conduction in this tube. If the signal supplied at terminals 26 contains a component at the natural frequency of oscillation of reed element 10, which is of sufficient amplitude to cause a substantial vibration of reed element 10, the resulting vibration of reed element 10 will strain member 12 and cause the potential appearing across capacitor 12' to rise to the firing potential of tube 20 as shown at 52 in Fig. 6. In drawing the waveforms of Fig. 6 it has been assumed that the signal supplied to terminals 26 is sufficient to cause the potential supplied by member 12 to rise to point 52 on curve 50 in approximately one quarter cycle of reed element 10. If the signal supplied at terminals 26 has a somewhat lower amplitude, the amplitude of vibration of reed element 10, and the peak amplitude of the potential generated by member 12, will gradually increase until the firing level of tube 20 is reached. This build up may take place over 5, 10 or even more complete vibrations of reed element 10.

Conduction through tube 20 will discharge capacitor 12' until the potential thereacross reaches the extinction potential as shown at 54 in Fig. 6. At this point tube 20 will cease to conduct and capacitor 12' will start to recharge through resistor 16. This recharging of capacitor 12' is represented by curve 56 in Fig. 6. This recharging curve 56 may be considered to be made up of two components. The first component is the exponential charging curve 58 and the second is the sinusoidal component 60 resulting from the straining of member 12 by reed element 10. The shock excitation of reed element due to the sudden discharging of capacitor 12' will tend to reinforce the oscillation of reed element 10 set up by the signal at 26. However, the potential of source 18 is made sufficiently low so that continued oscillations in the circuit cannot take place unless the signal at terminals 26 remains above a preselected level. Therefore, if the signal which resulted in the discharge of tube 20 is removed or changes frequency before the potential across capacitor 12' has risen to a potential equal to approximately the supply potential of source 18, the potential appearing across tube 20 will not reach the firing potential and the oscillation of reed element 10 will gradually die out. Under these conditions the output signal at terminals 22 will be a single pulse of relatively high amplitude corresponding to the curve 52–54–56 of Fig. 6. If the signal at the natural frequency of oscillation of reed element 10 continues for an appreciable number of cycles of reed element 10, tube 20 will fire each time the potential across capacitor 12, reaches a value approximately equal to potential $E_{bb}$. Since tube 20 will fire only when the positive peak component 60 is superimposed on the potential supplied to source 18, the firing of the tube 20 will occur at the natural frequency of oscillation of reed element 10. The signal appearing at terminals 22 under these conditions will be a series of substantially sawtooth signals at the frequency of reed element 10 which is the same as the frequency of the exciting signal supplied to terminals 26. This sawtooth signal may be passed through an appropriate filter to recover the fundamental component thereof which will have an amplitude much greater than the amplitude of the signal supplied at terminals 26. Therefore the system just described acts as a frequency sensitive threshold detector having a substantial power gain. As explained above, the frequency sensitivity of the circuit results from the fact that reed element 10 will be excited into sustained oscillations of an appreciable amplitude only by a signal at the resonant frequency of this element or at some harmonic of this frequency.

One possible modification of the circuit just described is to supply the signal to be detected to terminals 22. Under these circumstances the circuit is not frequency sensitive but would conduct whenever the amplitude of the input signal exceeded the difference between the firing potential $E_f$ and the potential $E_{bb}$ supplied by source 18. In another modified form of the invention the time constant of the charging circuit of Fig. 6 may be increased so that the firing potential $E_f$ is reached after an integral number of cycles of waveform 60, in which case the output signal will have a fundamental frequency equal to a submultiple of the frequency of vibration of reed element 10.

Still another modification of the system of Fig. 5 consists of replacing electrostrictive member 14 with an electromagnetic drive system of the type described in our above-identified copending application. Our current limiting devices such as a pentode vacuum tube may be substituted for resistor 16 without departing from the invention. Various other modifications of the circuit herein described will occur to those skilled in the art. Therefore, while we have described what is at present the preferred embodiments of the present invention, the true scope of the invention is to be determined by a reference to the hereinafter appended claims.

What is claimed is:

1. An electromechanical oscillator circuit comprising a mechanically vibratory system including a vibratory reed member and at least one electrostrictive member secured thereto in a position to be strained by the vibrations thereof, said electrostrictive member having spaced conductive area electrodes disposed thereon thereby to form a capacitor, said system being arranged to be excited into vibration by the rapid discharge of said capacitor and to cause an alternating voltage to appear across said capacitor as a result of said straining due to said vibrations, current limiting means connected in series with said capacitor, a source of D.-C. potential, means connecting said source across said series combination, and a gaseous discharge device connected in shunt with said capacitor, said gaseous discharge device having a firing potential less than the potential supplied by said source, the characteristic of said current limiting means being selected to be such that the interval between successive discharges of said capacitor through said gaseous discharge device is substantially equal to a fixed integral multiple of the period of vibration of said vibratory system.

2. An electromechanical oscillator circuit comprising a mechanically vibratory system including a vibratory reed member and first and second electrostrictive members secured thereto, each of said electrostrictive members having spaced conductive area electrodes disposed thereon thereby to form a capacitor, said system being arranged to be excited into vibration by the rapid discharge of said capacitor including said first electrostrictive member and to cause an alternating voltage to appear across both of said capacitors as a result of the vibrations of said reed member, a resistor connected in series with said capacitor including said first electrostrictive member, a source of D.-C. potential, means connecting said source across said series combination, a gaseous discharge device connected in shunt with said capacitor including said first electrostrictive member, said gaseous discharge device having a firing potential less than the potential supplied by said source, the time constant of said series resistor-capacitor circuit being selected to be such that the discharge of said capacitor including said first electrostrictive member through said gaseous discharge device is substantially equal to a fixed integral multiple of the period of vibration of said vibratory system.

3. A frequency sensitive detector circuit comprising a mechanically vibratory system including at least one electrostrictive member having spaced conductive area electrodes disposed thereon thereby to form a capacitor, said system being arranged to cause an alternating voltage to appear across said capacitor as a result of the vibrations of said system, a current limiting means connected in series with said capacitor, a source of D.-C. potential connected across said series combination, a gaseous discharge device connected in shunt with said capacitor, the potential supplied by said source being lower than the firing potential of said discharge device by an amount less than the maximum peak amplitude of said alternating voltage across said capacitor, and means responsive to the signal to be detected for driving said vibratory system in accordance with the frequency spectrum of the said signal to be detected.

4. A frequency sensitive detector circuit comprising a mechanically vibratory system including a vibratory reed element and at least one electrostrictive member secured thereto, said electrostrictive member having spaced conductive area electrodes disposed thereon thereby to form a capacitor, said system being arranged to cause an alternating voltage to appear across said capacitor as a result of the vibrations of said reed element, a current limiting means connected in series with said capacitor, a source of D.-C. potential connected across said series combination, a gaseous discharge device connected in shunt with said capacitor, the potential supplied by said source being lower than the firing potential of said discharge device by an amount less than the maximum peak amplitude of said alternating voltage across said capacitor, and means responsive to the signal to be detected for exerting a force on said reed element which varies as the time variation in amplitude of the signal to be detected.

5. A frequency sensitive detector circuit comprising a mechanically vibratory system comprising a vibratory reed element and first and second electrostrictive members secured thereto, said first electrostrictive member having spaced conductive area electrodes disposed thereon thereby to form a capacitor, said system being arranged to cause an alternating voltage to appear across said capacitor as a result of the vibrations of said reed member, a resistor connected in series with said capacitor, a source of D.-C. potential connected across said series combination, a gaseous discharge device connected in shunt with said capacitor, the potential supplied by said source being lower than the firing potential of said discharge device by an amount less than the maximum peak amplitude of said alternating voltage across said capacitor, said second electrostrictive means being provided with spaced electrodes disposed thereon, and means for supplying the signal to be detected to said electrodes on said second electrostrictive member, said vibratory system being arranged to be set into vibration by a signal which has a frequency integrally related to the natural frequency of vibration of said vibratory system.

6. An electromechanical oscillator circuit comprising a vibratory system including a vibratory element and first and second capacitors, each capacitor comprising an electrostrictive member having spaced conductive area electrodes disposed thereon, said electrostrictive members being coupled to said vibratory element so as to be strained by the vibrations thereof, said system being arranged to be set into vibration by the rapid discharge of said first capacitor and to cause an alternating voltage to appear across both said capacitors as a result of said vibrations, current limiting means connected in series with said first capacitor, a source of D.-C. potential, means for connecting said source across said series combination, and a gaseous discharge device connected in shunt with said first capacitor, said gaseous discharge device having a firing potential less than the potential supplied by said source, the characteristic of said current limiting means being selected to be such that the interval between successive discharges of said first capacitor through said gaseous discharge device is substantially equal to a fixed integral multiple of the period of vibration of said vibratory system, whereby the signal appearing across said second capacitor is a substantially pure sinusoidal voltage having a period equal to the period of vibration of said vibratory system.

References Cited in the file of this patent

UNITED STATES PATENTS

| | | |
|---|---|---|
| 1,693,806 | Cady | Dec. 4, 1928 |
| 1,930,278 | Marrison | Oct. 10, 1933 |
| 2,614,144 | Howatt | Oct. 14, 1952 |
| 2,621,294 | Podbielniak | Dec. 9, 1952 |